(12) United States Patent
Wakata et al.

(10) Patent No.: US 6,551,147 B2
(45) Date of Patent: Apr. 22, 2003

(54) BATTERY TERMINAL PROVIDED WITH A CURRENT SENSOR

(75) Inventors: Shigekazu Wakata, Yokkaichi (JP); Masanori Wakui, Aichi-ken (JP); Hisao Niwa, Aichi-ken (JP); Naohiko Suzuki, Aichi-ken (JP)

(73) Assignee: Sumitomo Wiring Systems, Ltd. (JP)

(*) Notice: Subject to any disclaimer, the term of this patent is extended or adjusted under 35 U.S.C. 154(b) by 0 days.

(21) Appl. No.: 09/999,017

(22) Filed: Oct. 31, 2001

(65) Prior Publication Data

US 2002/0051906 A1 May 2, 2002

(30) Foreign Application Priority Data

Nov. 1, 2000 (JP) ........................................ 2000-335032

(51) Int. Cl.⁷ ................................................. H01R 4/28
(52) U.S. Cl. ...................... 439/754; 320/105; 439/763; 439/522
(58) Field of Search ................................ 439/754, 756, 439/763, 758, 762, 764, 522, 621; 337/166, 186; 429/93, 92; 320/105

(56) References Cited

U.S. PATENT DOCUMENTS 4,675,255 A * 6/1987 Pfeifer et al. .................. 429/32
5,645,448 A * 7/1997 Hill .............................. 439/763
6,218,805 B1 * 4/2001 Melcher ....................... 320/105
6,294,978 B1 * 9/2001 Endo et al. .................. 439/754

FOREIGN PATENT DOCUMENTS

| FR | 2 293 073 | 6/1976 |
| FR | 2 702 310 | 9/1994 |
| JP | 7-122260 | 5/1995 |

* cited by examiner

*Primary Examiner*—P. Austin Bradley
*Assistant Examiner*—Briggitte R. Hammond
(74) *Attorney, Agent, or Firm*—Gerald E. Hespos; Anthony J. Casella

(57) ABSTRACT

A battery-side terminal (2) includes a fastening ring (5) to be fixed to a battery post (1), and a connecting piece (8) extends from the fastening ring (5). A current sensor (4) includes a sensor portion (4A) formed with a slit (14) through which the connecting piece (8) is insertable. The battery-side terminal (2) and the current (4) are transported to a connection site while being assembled into one unit. At the connection site, the connecting piece (8) and the harness-side terminal (3) are aligned and placed one over the other, and are tightened by means of a bolt. This tightening operation is performed at a position distanced from a battery, and hence can be performed smoothly performed without being hindered.

9 Claims, 6 Drawing Sheets

BATTERY TERMINAL PROVIDED WITH A CURRENT SENSOR

BACKGROUND OF THE INVENTION

1. Field of the Invention

The present invention relates to a battery terminal provided with a current sensor.

2. Description of the Related Art

The kinds and number of electric parts of a vehicle continually increase, and, accordingly, the electric energy produced by a vehicle battery is exhausted more quickly. As a result, the remaining capacity of the battery should be monitored. A current sensor may be mounted on a battery post to monitor the remaining capacity. The current sensor detects the intensity of the current, and hence determines the degree of exhaustion of the battery.

Unfortunately, there generally is insufficient space to mount the current sensor around the battery post of the existing battery. The current sensor could be mounted on a wiring harness that is connected with battery post. However, the current sensor could be struck against something and broken during handling of the wiring harness.

The present invention was developed in view of the above, and an object of the invention is to provide a battery terminal with a current sensor that can be mounted easily and that is not likely to be broken.

SUMMARY OF THE INVENTION

The invention is directed to a battery terminal assembly with a current sensor. The assembly comprises a battery-side terminal configured for connection with a battery post and a harness-side terminal configured for connection with the leading end of a wire, preferably of a wiring harness. A fastening means enables the terminals to be disconnected from and connected with each other. The assembly further comprises a current sensor mounted at a connecting portion where the battery-side terminal and the harness-side terminal are connected.

The current sensor can be mounted on the battery-side terminal well before the connection of the harness-side terminal. The fastening means then is employed at a later time to connect the harness-side terminal to the current sensor and the battery-side terminal. Alternatively, the current sensor may be mounted on the battery-side terminal at the time of connection of the harness-side terminal with the battery-side terminal. With either option, the current sensor is not mounted initially on a wiring harness, and cannot be damaged during transportation and handling of the wiring harness.

The battery terminal assembly may comprise a mounting portion that extends from the battery-side terminal. The current sensor may be mountable on the mounting portion prior to connection with the harness-side terminal.

Alternatively, the mounting portion may extend from the harness-side terminal. The current sensor may be mounted on the mounting portion of the harness-side terminal at the time of connection of the both terminals. Therefore, an existing terminal can be used as the battery-side terminal.

A linking member may be provided between the battery-side terminal and the harness-side terminal, and the current sensor may be mounted on the linking member. Accordingly, existing terminals can be used as the battery-side terminal and the harness-side terminal.

According to a further embodiment, the connecting portion has at least one mounting piece for connection with the current sensor.

The connecting portion preferably is insertable into a slit provided in the current sensor.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
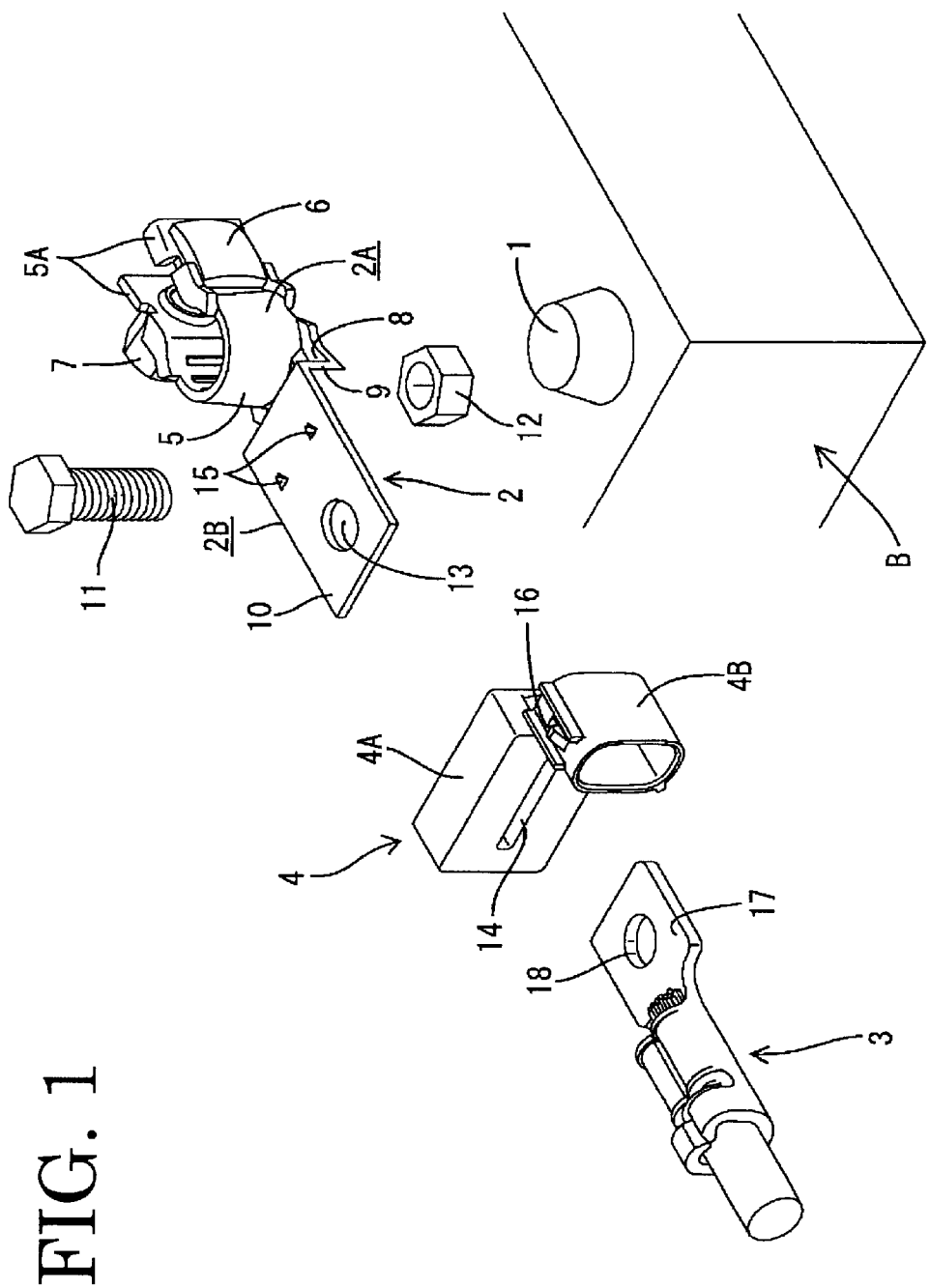
FIG. 1 is an exploded perspective view of a first embodiment.
Figure 2:
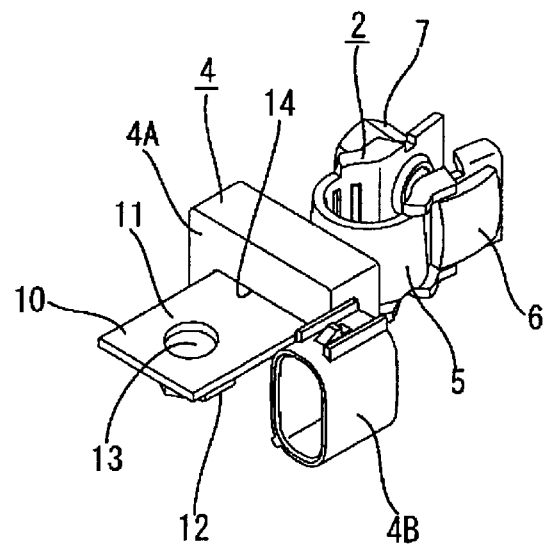
FIG. 2 is a perspective view showing a state where a current sensor is mounted on a battery-side terminal.
Figure 3:
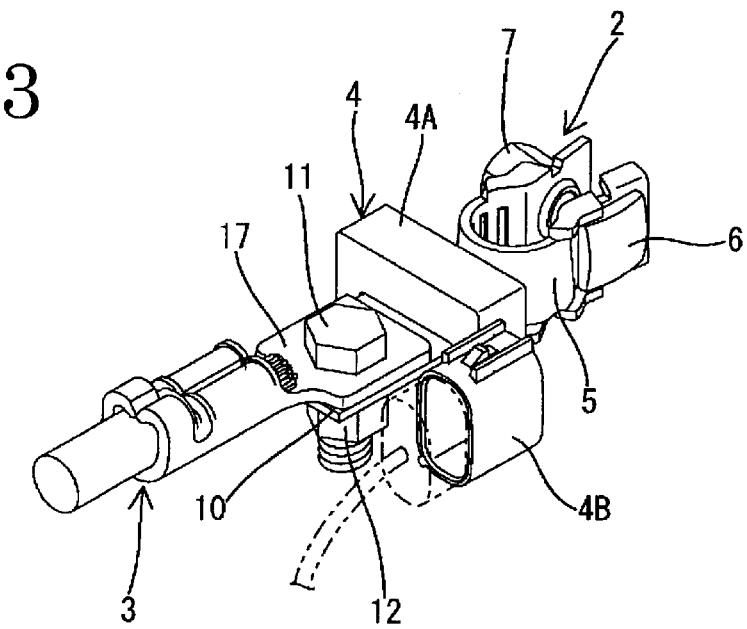
FIG. 3 is a perspective view showing a state of a battery terminal where a harness-side terminal is connected.

A battery of an automotive vehicle is identified by the letter B in FIG. 1. The battery B has two battery posts 1 that extend from a surface of the battery B (only one battery post is shown in FIG. 1). Each battery post 1 is in the form of a truncated cone that is slightly tapered toward the top, and a battery-side terminal 2 is connectable with the battery post 1.

The battery-side terminal 2 is formed by bending an electrically conductive plate, and is comprised of a fastening portion 2A and a mounting portion 2B. The fastening portion 2A has a split tubular fastening ring 5 that is configured and dimensioned for fitting over the battery post 1 from an insertion side. Opposed walls 5A extend from ends of the fastening ring 5 at the split. A clamp bolt 6 penetrates laterally through the opposed walls 5A, and a nut 7 engages the shaft of the clamp bolt 6. The clamp bolt 6 has a polygonal head that engages edges of one of the opposed walls 5A to prevent further turning. The opposed walls 5A can be brought closer to each other by tightening the clamp bolt 6 and the nut 7, thereby tightening the fastening ring 5 and causing the fastening ring 5 to bite in the battery post 1.

The mounting portion 2B extends integrally or unitarily from a bottom edge of the fastening ring 5 substantially opposite from the opposed walls 5A. More specifically, a connecting piece 8 extends substantially laterally from the fastening ring 5, a step 9 is bent up at the leading end of the connecting piece 8, and a mounting plate 10 extends laterally from the step 9. An insertion hole 13 is formed near the leading end of the mounting plate 10. A bolt 11 can pass through the insertion hole 11 and cooperates with a nut 12 to form a fastening means. Clasping pieces 15 are cut and bent to project from a surface of the mounting plate 10 between the insertion hole 11 and the step 9.

The current sensor 4 is comprised of a sensor portion 4A and a connector portion 4B. The sensor portion 4A has an unillustrated built-in detector (e.g. using a Hall device or the like) for detecting a current supplied from the battery B to loads connected with a wiring harness. The connector portion 4B projects integrally or unitarily from one side of the sensor portion 4A. A ring-shaped detector preferably is embedded in the sensor portion 4A by insert-molding of a synthetic resin, and a slit 14 penetrates substantially in the center of the sensor portion 4A for permitting insertion of the mounting plate 10 of the mounting portion 2B. The mounting plate 10 is inserted through the slit 14, and the clasping pieces 15 bite in the inner wall of the slit 14, thereby fixing the current sensor 4 to the battery-side terminal 2.

The connector portion 4B is molded integrally or unitarily with the sensor portion 4A and is continuous with one side of the sensor portion 4A. The connector portion 4B is substantially tubular and is open at one side so that a terminal fitting connected with the ring-shaped detector can be mounted therein. The connector portion 4B can be fit to a mating connector that is connected with an unillustrated current detecting circuit to enable a current measurement or detection, preferably by terminal fittings mounted inside being electrically connectable with each other. A locking claw 16 projects from the upper surface of the connector portion 4B for holding the connector portion 4B connected with the mating connector.

The harness-side terminal 3 has an existing construction and is connected with a wire that extends from an unillustrated load. A coupling plate 17 is formed at the front of the harness-side terminal 3 and preferably has substantially the same width as the mounting plate 10 of the battery-side terminal 2. The coupling plate 17 is formed with an insertion hole 18 that is aligned with the insertion hole 13 when the coupling plate 17 and the mounting plate 10 are aligned and placed one over the other.

The mounting plate 10 is inserted through the slit 14 of the current sensor 4 so that the clasping pieces 15 bite in the inner wall surface of the slit 14 and so that the insertion hole 13 is exposed beyond the sensor portion 4A. The nut 12 then is fixed to the bottom surface of the mounting plate 10, preferably by welding, to align with the insertion hole 13. Thus, the battery-side terminal 2 and the current sensor 4 are formed into one unit, which then is transported to a connection site for connection with the battery post 1.

At the connection site, the fastening ring 5 of the battery-side terminal 2 is fitted to the battery post 1, and is tightened by tightening the clamp bolt 6. Thus, the inner circumferential surface of the fastening ring 5 is reduced and fitted to in the battery post 1. In this way, the battery-side terminal 2 is connected with the battery post 1. The coupling plate 17 of the harness-side terminal 3 then is placed on the mounting plate 10 of the battery-side terminal 2 with the insertion holes 13, 18 substantially aligned with each other. The bolt 11 then is inserted through the holes 13, 18 and screwed into the nut 12 by, e.g. an impact wrench. As a result, the battery-side terminal 2 and the harness-side terminal 3 are connected with each other. The connecting operation is completed by fitting the mating connector into the connector portion 4B of the current sensor 5.

A current flowing between the battery B and the load can be detected by the ring-shaped detector, and a degree of exhaustion of the battery can be judged based on the detected value.

As described above, the bolt 11 and the nut 12 are tightened at a position distanced from the battery post 1. Thus, the tightening operation can be performed smoothly at a location where there is sufficient space for a tightening tool. Further, the current sensor 4 is transported to the connection site while assembled with the battery-side terminal 2 instead of being mounted on the wiring harness. Thus, the current sensor 4 can be protected and mounted more easily.

Figure 4:
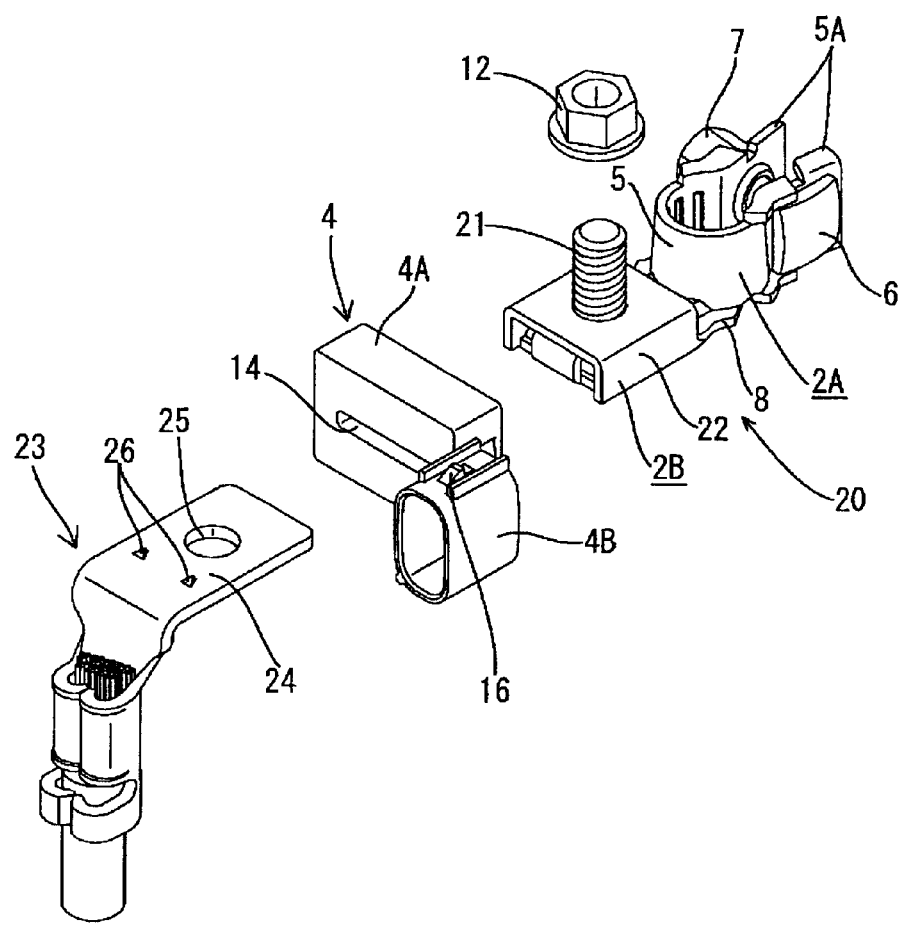
FIG. 4 is an exploded perspective view of a second embodiment.
Figure 5:
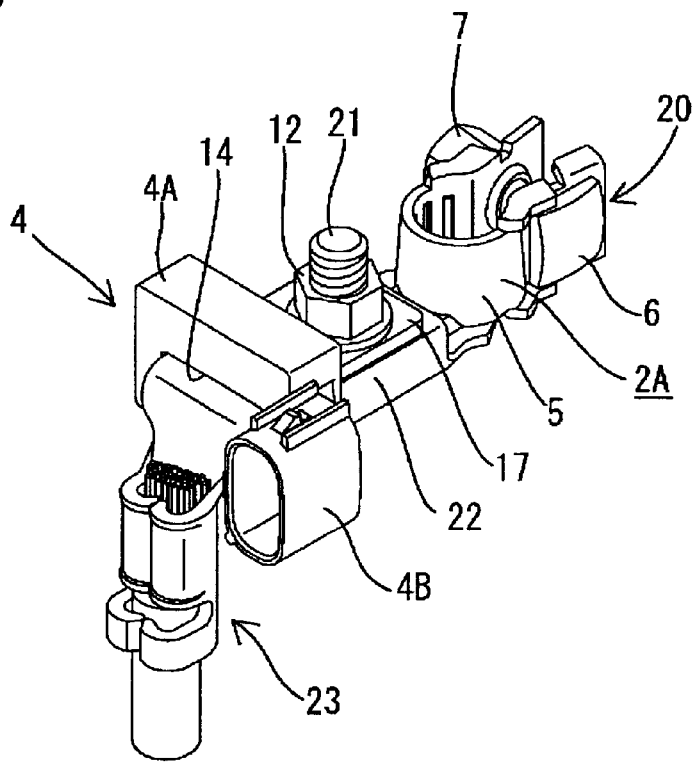
FIG. 5 is a perspective view showing a state where a battery-side terminal and a harness-side terminal are connected.

FIGS. 4 and 5 show a second embodiment of the present invention. The current sensor 4 of the second embodiment is similar to the first embodiment. However, the fastening means of the second embodiment differs from the first embodiment. More particularly, the fastening means of the second embodiment has a known battery-side terminal 20 with a resting portion 22 and a bolt 21 connected by welding.

A harness-side terminal 23 has a coupling plate 24 that is longer than that of the first embodiment and is insertable into the slit 14 of the current sensor 4. The coupling plate 24 has an insertion hole 25. Mounting pieces 26 are formed preferably by cutting and bending or embossing the coupling plate 24 at locations behind the insertion hole 25. The coupling plate 24 is inserted through the slit 14 until the insertion hole 25 completely passes the slit 14. This insertion causes the mounting pieces 26 to bite in or engage the inner wall of the slit 14. The bolt 11 of the battery-side terminal 2 then is inserted into the insertion hole 25 to mount the current sensor 4. The base of the illustrated coupling plate 24 is bent down to arrange a wire along a side of the battery B. However, the cutting plate 24 can be left straight without being bent.

The method for fixing the current sensor 4 to the coupling plate 24 may be selected from various methods including adhesion and insert-molding.

The battery-side terminal 20 and the current sensor 4 of the second embodiment are transported separately to the connection site. The battery-side terminal 20 then is connected with the battery post 1 at the connection site, as described above. Subsequently, the coupling plate 24 of the harness-side terminal 23 is inserted through the slit 14 of the current sensor 4, the bolt 21 of the battery-side terminal 20 is inserted through the insertion hole 25, and the nut 12 is fastened to the bolt to complete the connection.

An existing terminal can be used as the battery-side terminal 2 in the second embodiment. Further, the bolt 21 can be tightened at a position distanced from the battery B where nothing hinders the tightening operation. Thus, the tightening operation is performed smoothly. Furthermore, the current sensor 4 is mounted initially prior to connection with the battery B instead of with the wiring harness. Hence, there is no likelihood that the current sensor 4 is broken while the wiring harness is handled.

Figure 6:
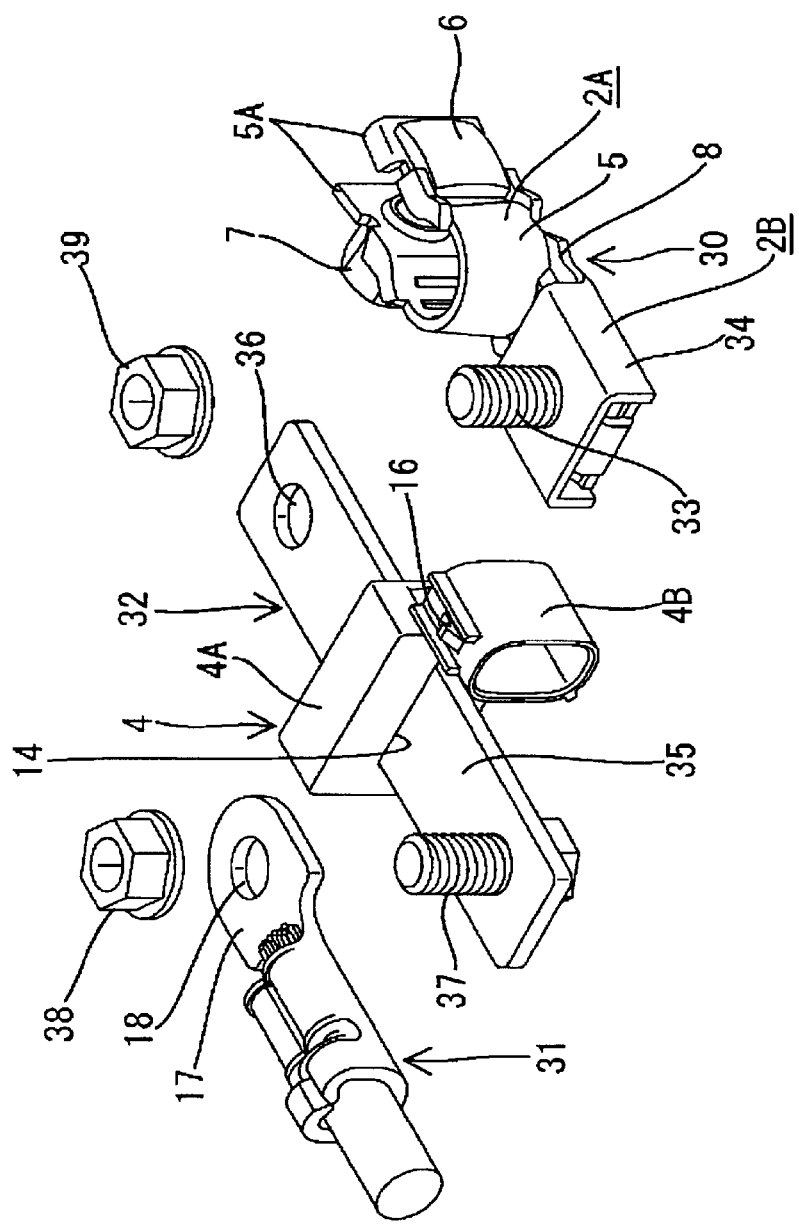
FIG. 6 is an exploded perspective view of a third embodiment.
Figure 7:
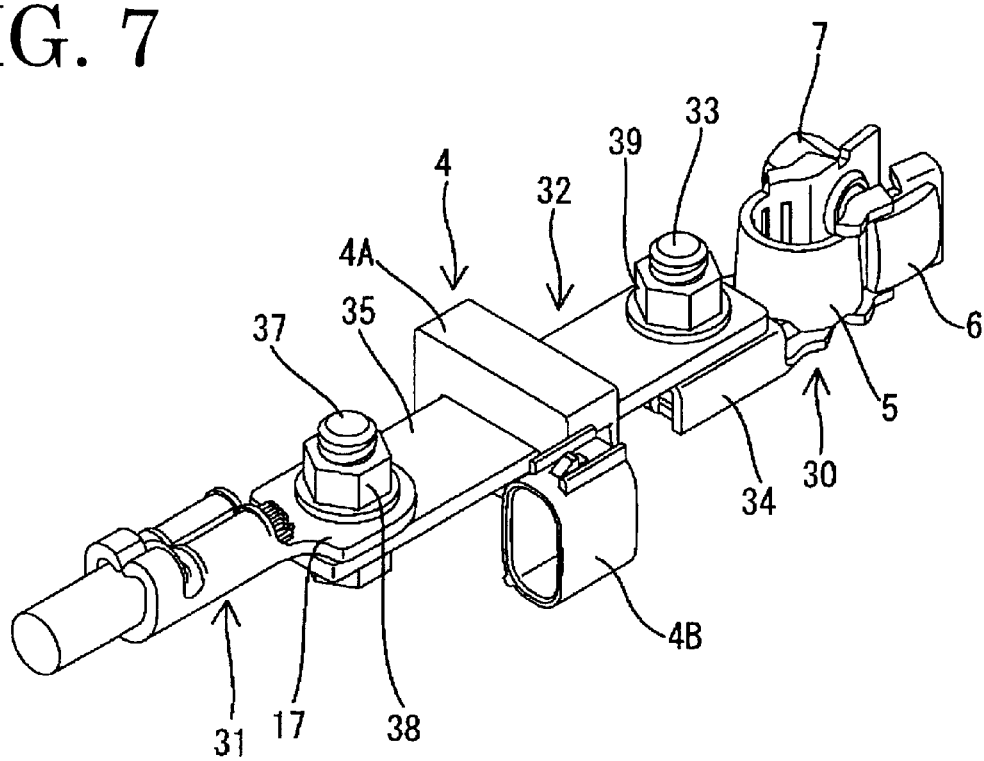
FIG. 7 is a perspective view showing a state where a battery-side terminal and a harness-side terminal are connected.

FIGS. 6 and 7 show a third embodiment, in which a battery-side terminal 30 and a harness-side terminal 31 are connected via a linking member 32.

The battery-side terminal 30 and the harness-side terminal 31 both have existing constructions. In particular, the harness-side terminal 31 has the same construction as that of the first embodiment and the battery-side terminal 30 is a terminal including a resting portion 34 with a bolt 33 as in the second embodiment.

The linking member 32 has a linking plate 35 made of a long piece of an electrically conductive metallic plate, and the current sensor 4 having the same construction as the first embodiment is mounted in the middle of this linking plate 35. The current sensor 4 is mounted on the linking plate 35 by cutting and bending or embossing mounting pieces, as in the first and second embodiments, to bite in the current sensor 4. Alternatively, the linking plate 35 may be mounted to the current sensor 4 by insert-molding, adhesion, and various other methods can also be considered as a mounting method.

A connection hole 36 for permitting insertion of the bolt 33 of the battery-side terminal 30 is formed at one end of the linking plate 35, and a connection bolt 37 is fixed at the other end by, e.g. welding and is connectable with the harness-side terminal 31 by a nut 38. Accordingly, the bolt 33, the connection bolt 37 and the nuts 38, 39 corresponding thereto form fastening means.

The third embodiment is assembled by first inserting the bolt 33 of the battery-side terminal 30 through the connection hole 36 of the linking plate 35 and tightening the nut 39. Thus, the assembly of the linking member 32 and the current sensor 4 are mounted on the battery-side terminal 30. In this way, the current sensor 4 is assembled with the battery-side terminal 30 together with the linking member 32, and this assembly is transported to a connection site for connection with the battery post 1.

The battery-side terminal 30 is connected with the battery post 1 at the connection site, as described above. The connection bolt 37 then is inserted through the insertion hole 18 of the harness-side terminal 31 and is tightened by the nut 38 to connect the harness-side terminal 31 and the linking member 32. Thus, the harness-side terminal 31 and the battery-side terminal 30 are connected via the linking member 32.

As described above, the current sensor 4 is mounted on the linking member 32 and the harness-side terminal 31 and the battery-side terminal 30 are connected via the linking member 32 in the third embodiment. As a result, existing terminals can be used as the battery-side terminal 30 and the harness-side terminal 31. Further, the current sensor 4 is transported to the connection site while being mounted on the linking member 32 and the bolts can be tightened to connect the battery-side terminal 30 and the harness-side terminal 31 at a position distanced from the battery B where nothing hinders the tightening operation. Therefore, the tightening operation can be performed smoothly. Furthermore, since the current sensor 4 is not connected with the harness-side terminal 31, it can be protected as in the first and second embodiments.

Various changes can be made in the present invention, and following embodiments are also embraced by the technical scope of the present invention as defined in the claims.

Although the current sensor 4 shown is provided internally with the ring-shaped detector, the shape and mode thereof can be changed in various manners and are not limited to those of the foregoing embodiments.

Although the current sensor 4 is formed with the slit 14 for mounting in any of the foregoing embodiments, another fixing method can be adopted unless the detector is formed ring-shaped.

What is claimed is:

1. A battery terminal to be provided with a current sensor, comprising:

a battery-side terminal configured for connection with a battery post, a harness-side terminal configured for connection with a wire, and a fastening means for selectively connecting and disconnecting the terminals with each other, a connecting portion connecting the battery-side terminal and the harness-side terminal, and wherein the current sensor is formed with a slit, the connecting portion being inserted into the slit for mounting the current sensor to the connecting portion.

2. The battery terminal of claim 1, wherein a mounting portion connected with the harness-side terminal extends from the battery-side terminal, and the current sensor is mounted on the mounting portion prior to connection of the terminals.

3. The battery terminal of claim 1, wherein a linking member to be coupled by the fastening means is provided between the battery-side terminal and the harness-side terminal, and the current sensor is mounted on the linking member.

4. The battery terminal of claim 1, wherein a mounting portion connected with the battery-side terminal extends from the harness-side terminal, and the current sensor is mounted on the mounting portion prior to connection of the both terminals.

5. The battery terminal of claim 1, wherein the connecting portion has at least mounting piece connected with the current sensor.

6. The battery terminal of claim 1, wherein the battery-side terminal is provided with a split tubular fastening ring dimensioned to be fastened to the battery post.

7. A battery terminal assembly, comprising:

a battery-side terminal with a fastening portion configured for connection with a battery post and a connecting portion extending from the fastening portion;

a harness-side terminal connected with a wire and releasably connected with the connecting portion of the battery-side terminal; and a current sensor mounted between the fastening portion and the harness-side terminal, the current sensor having a slit, and the connecting portion of the battery-side terminal passing through the slit.

8. The battery terminal assembly of claim 7, wherein the connecting portion of the battery-side terminal has at least one mounting piece securely engaged with the current sensor.

9. The battery terminal of claim 8, wherein the mounting piece is engaged in the slit.

* * * * *